US006534877B2

(12) United States Patent
Ellis et al.

(10) Patent No.: US 6,534,877 B2
(45) Date of Patent: Mar. 18, 2003

(54) SEMICONDUCTOR COPPER BOND PAD SURFACE PROTECTION

(75) Inventors: Timothy W. Ellis, Doylestown, PA (US); Nikhil Murdeshwar, Abington, PA (US); Mark A. Eshelman, Lansdale, PA (US)

(73) Assignee: Kulicke & Soffa Investments, Inc., Wilmington, DE (US)

( * ) Notice: Subject to any disclaimer, the term of this patent is extended or adjusted under 35 U.S.C. 154(b) by 0 days.

(21) Appl. No.: 10/051,482

(22) Filed: Jan. 18, 2002

(65) Prior Publication Data

US 2002/0168845 A1 Nov. 14, 2002

Related U.S. Application Data

(62) Division of application No. 09/330,906, filed on Jun. 11, 1999, now Pat. No. 6,352,743.
(60) Provisional application No. 60/103,032, filed on Oct. 5, 1998, and provisional application No. 60/127,249, filed on Mar. 31, 1999.

(51) Int. Cl.[7] ............................................. H01L 23/48
(52) U.S. Cl. ........................ 257/779; 257/734; 257/762; 257/781

(58) Field of Search .................................. 257/734–738, 257/762, 779–784, 786; 438/612–617

(56) References Cited

U.S. PATENT DOCUMENTS

| | | | | |
|---|---|---|---|---|
| 3,641,298 A | * | 2/1972 | Broverman | |
| 4,891,333 A | * | 1/1990 | Baba et al. | |
| 5,272,376 A | | 12/1993 | Ueno | 257/737 |
| 5,771,157 A | | 6/1998 | Zak | 361/760 |
| 5,785,236 A | | 7/1998 | Cheung et al. | 228/180.5 |

* cited by examiner

Primary Examiner—Ha Tran Nguyen
(74) Attorney, Agent, or Firm—Synnestvedt & Lechner LLP

(57) ABSTRACT

Methods of protecting from atmospheric contaminants, or removing atmospheric contaminants from, the bonding surfaces of copper semiconductor bond pads by coating a bond pad with a layer of a ceramic material having a thickness that is suitable for soldering without fluxing and that is sufficiently frangible during ball or wedge wire bonding to obtain metal-to-metal contact between the bonding surfaces and the wires bonded thereto. Coated semiconductor wafers are also disclosed.

24 Claims, 1 Drawing Sheet

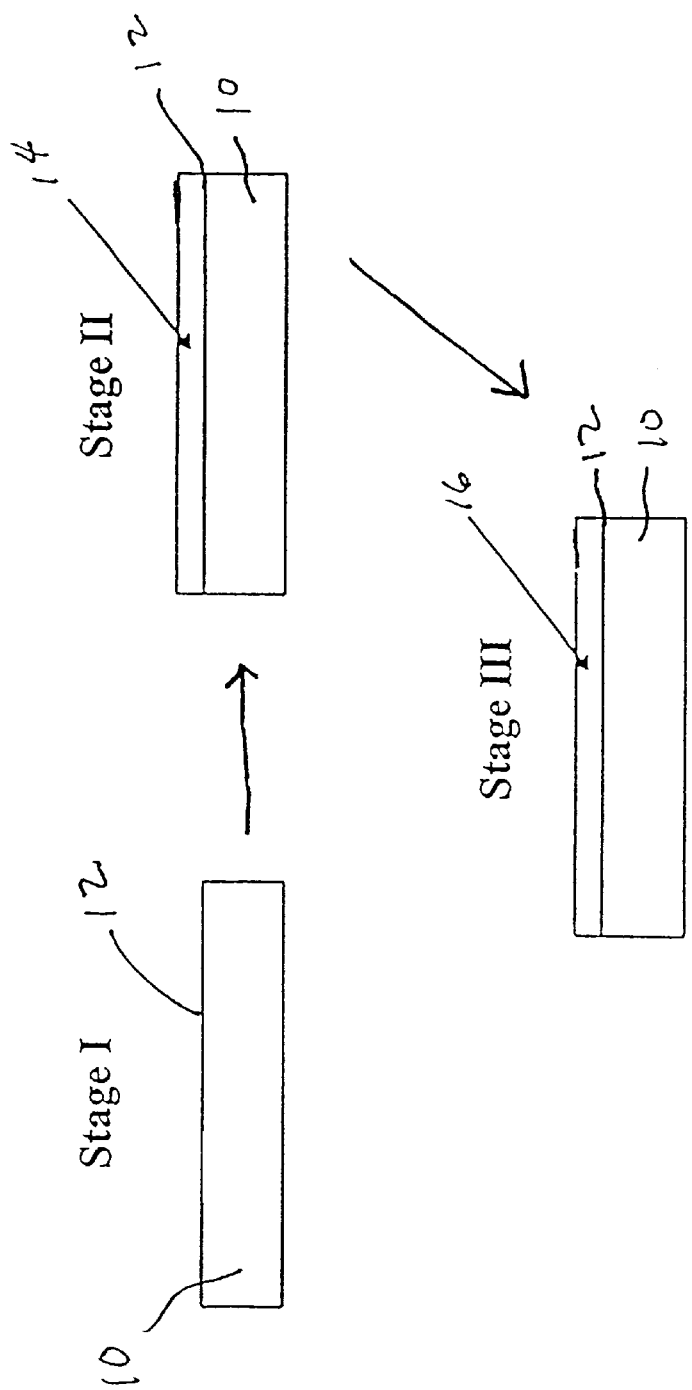

SEMICONDUCTOR COPPER BOND PAD SURFACE PROTECTION

CROSS-REFERENCE TO RELATED APPLICATIONS

This application is a Divisional Application of U.S. patent application Ser. No. 09/330,906 filed Jun. 11, 1999, now U.S. Pat. No. 6,352,743, the disclosure of which is incorporated herein by reference, which application, in turn, claims priority under 35 U.S.C. §119(e) from U.S. Provisional Application No. 60/103,032 filed Oct. 5, 1998 and No. 60/127,249 filed Mar. 31, 1999, the disclosures of both of which are incorporated herein by reference.

BACKGROUND OF THE INVENTION

The present invention relates to methods for protecting semiconductor copper bond pad surfaces with ceramic coatings that are sufficiently frangible during ball, wedge or flip chip bonding to obtain metal-to-metal contact between the bonding surfaces and the wires bonded thereto. The method protects the copper bond pads during extended exposure to water and water solutions such as are experienced during sawing.

The use of copper bond pads on semiconductor devices would be an attractive alternative to that of aluminum, were it not for atmospheric contamination of the copper surface, which oxidizes readily to form a coating that is not removable by standard methods of wire bonding machines, and requires the use of fluxes in solder-type interconnects, e.g., flip chip bonding. Present attempts to overcome this problem involve the use of a cover gas that is unavoidably expensive and complex and restricts bond head and work holder movement, or the use of a noble metal or overplating with inert metals which are more costly and can lead to the formation of unwanted intermetallic compounds at the bond pad interface.

U.S. Pat. No. 5,771,157 encapsulates a wedge bond of an aluminum wire to a copper pad with the resin, after the bond is formed. No protection against oxidation is provided to the copper pad prior to wedge bonding.

U.S. Pat. No. 5,785,236 protects a copper bond pad from oxidation with a surface layer of aluminum. This detracts from the advantages sought to be obtained by replacing aluminum bond pads with copper bond pads.

There remains a need for methods by which copper bond pad surfaces may be protected from oxidation prior to wire bonding or flip chip soldering.

SUMMARY OF THE INVENTION

This need is met by the present invention. Ceramic coatings have now been developed for the bonding surfaces of copper bond pads that are sufficiently frangible to obtain metal-to-metal contact between the bonding surface and the wire bonded thereto during ball or wedge wire bonding, and to obtain a surface suitable for soldering without fluxing.

Therefore, according to one aspect of the present invention, a method is provided for protecting from atmospheric contaminants, or removing atmospheric contaminants from, the bonding surface of a copper semiconductor bond pad by coating the bonding surface with a layer of a ceramic material having a thickness that is suitable for soldering without fluxing and that provides the layer with a hardness that is sufficiently frangible during ball or wedge wire bonding to obtain metal-to-metal contact between the bonding surface and the wire bonded thereto.

The present invention thus provides semiconductor devices having copper bond pads with surface layer coatings that are capable of being removed at bonding or soldering. Therefore, according to another aspect of the present invention, a semiconductor device is provided containing at least one copper bond pad having a bonding surface coated with a layer of a ceramic material having a thickness that is suitable for soldering without fluxing and which provides the layer with the aforementioned hardness.

This aspect of the present invention includes semiconductor devices having copper bond pads with surface layer coatings of rare earth metals that form complexes with copper. The surface layer has a thickness that, upon formation of the copper complex and exposure to a reducing environment containing hydrogen, forms a ceramic hydride layer having a thickness that is suitable for soldering without fluxing and which provides the layer with the aforementioned hardness.

This aspect of the present invention thus also includes semiconductor devices having copper bond pads with protective ceramic metal hydride coatings. Therefore, according to another aspect of the present invention, a semiconductor device is provided containing at least one copper bond pad having a bonding surface coated with a surface layer of a metal hydride compound selected from metal hydrides of copper-rare earth metal complexes and metal hydrides of copper-immiscible metals that form metal hydrides, in which the surface layer has a thickness that is suitable for soldering without fluxing and which provides the layer with the aforementioned hardness.

The inventive method provides the ability to bond wire to copper pads using existing equipment without modification of the wire bonder, and without additional costs and limitations of cover gas technology and hardware. The foregoing and other objects, features, and advantages of the present invention are more readily apparent from the detailed description of the preferred embodiments set forth below, taken in conjunction with the accompanying drawing.

BRIEF DESCRIPTION OF THE DRAWING

The sole drawing FIGURE is a schematic diagram of a method according to the present invention, in which semiconductor devices according to the present invention having copper bond pads with bonding surfaces coated with hydride-forming materials and metal hydrides are also depicted.

DETAILED DESCRIPTION OF THE PREFERRED EMBODIMENT

The present invention forms protective ceramic coating layers on copper bond pad bonding surfaces with thicknesses that are suitable for soldering without fluxing. The ceramic layer thickness is selected to provide at least the minimum hardness required for the layer to be sufficiently frangible during ball or wedge wire bonding to obtain metal-to-metal contact between each bonding surface and the wire bonded thereto.

Ceramic, rather than metallic, coatings are employed because metallic layers would be ductile and would plastically deform under impact. Because ceramic materials cannot be deformed in the plastic region, impact shatters the layer and allows it to be pushed aside during wire bonding.

Essentially all commonly used ceramic materials have a hardness suitable for use with the present invention. One measure of ceramic hardness is the Rockwell Superficial Hardness Scale (45-N) which is defined in Somiya, *Advanced Technical Ceramics* (Prentice Hall, Englewood Cliffs, N.J. 1996). Ceramic materials suitable for use with the present invention have a Rockwell Hardness (N-45) greater than about 38.

For purposes of the present invention, the meaning of the term-ceramic materials is adopted as it is defined in Callister, *Materials Science and Engineering, An Introduction* (3rd Ed., John Wiley & Sons, New York 1994) at page 4. Callister defines ceramic materials as compounds between metallic and nonmetallic elements that are most frequently oxides, nitrides and carbides. Ceramic materials within this classification include ceramic materials composed of clay minerals, cement and glass. Ceramic materials are insulative to the passage of electricity and heat, and are more resistant to high temperatures and harsh environments than metals and polymers. Regarding mechanical behavior, ceramic materials are hard but very brittle.

A method and apparatus of the present invention are depicted in the sole drawing FIGURE, in which bonding surface 12 of copper bond pad 10 of a semiconductor device (not shown) is cleaned (Stage I). If the copper surface is fresh and has not been exposed to a contaminating atmosphere, Stage I cleaning is not required. In the depicted embodiment, the bonding surface 12 is coated with a layer 14 of a hydride-forming copper-immiscible metal or copper-complexing rare earth metal (Stage II). For proper coating of surface layer 14, it is necessary to reduce the oxides, hydroxides and sulfides that form on the surface 12 of pad 10. Only after this reduction is complete can proper surface coating be performed. The surface 12 can be reduced by exposure to a reducing atmosphere, such as an atmosphere containing hydrogen, or by essentially any other conventional surface reducing techniques, including cleaning techniques such as plasma cleaning.

Examples of metals that are completely immiscible in copper include, but are not limited to, Ta, V and Nb. Examples of rare earth metals that complex with copper include, but are not limited to, La, Y, and Ce.

The surface 12 of copper pad 10 is coated with metal layer 14 by conventional vapor deposition or analogous techniques. The rare earth metals may require a heating step after deposition for the copper complex to form.

Surface layers of copper-immiscible hydride-forming metals can be formed by an alternative route. The copper-immiscible metal may be co-deposited with the copper as the copper bond pads are formed during wafer fabrication. By heating the wafers after fabrication, the co-deposited immiscible metal will migrate to the surface of the copper bond pad, forming an oxidation-protective layer. Electroless or electrodeposition techniques may also be employed.

The deposited layer 14 should be of a thickness capable of forming a frangible hydride layer. That is, the resulting ceramic layer should have a thickness sufficient to provide the layer with a Rockwell Hardness (N-45) greater than about 38. Suitable ceramic layers have a thickness between about 10 and about 1,000 angstroms, with a thickness between about 25 and about 500 angstroms being preferred.

When a rare earth metal is employed, it is preferably deposited in a layer thin enough to form an essentially pure copper complex. This can be accomplished using rare earth metal layers with thickness from about 10 to about 1,000 Angstroms.

Copper-immiscible metal layers are preferably thin enough to be cost competitive and permit ease of fabrication. For these purposes, the layer 12 should be no thicker than $\frac{1}{10}$ the total combined thickness of the pad 10 and layer 14. A thickness from about 10 to about 1,000 Angstroms is preferred.

Layer 14 is then converted to a hydride layer (Stage III) by reduction with hydrogen, either by heating the bond pad in an atmosphere containing hydrogen, or by exposing the bond pad to a hydrogen-containing plasma, e.g, plasma-cleaning operations. Once formed, the hydride layer 16 is stable at room temperature.

It is not necessary for deposition or hydride conversion of the layer 14 to be performed at the time of wafer fabrication. Both processes can be done at a later time. As noted above, for proper deposition of the layer 14, the surface 12 of bond pad 10 must be cleaned prior to deposition.

The hydride-formation step can take place at any stage prior to wire bonding or flip chip bonding, so long as the reducing environment is sufficiently aggressive enough to reduce the layer 14 to remove any atmospheric contamination. Suitable reducing conditions can be readily determined by those of ordinary skill in the art without undue experimentation.

The hydride layer 16 provides the surface 12 of bond pad 10 with oxidation resistance. Yet, because the hydride layer is frangible, conventional ball or wedge wire bonding can be performed to obtain metal-to-metal contact between surface 12 and the wire bonded thereto (not shown), which also provides a surface prepared for soldering operations.

The hydride compound rapidly disintegrates during wire bonding or soldering by two mechanisms. One mechanism is mechanical, and derives from the frangibility of the hydride layer. The hydride will also thermally de-hydride during bonding, forming a hydrogen cover over the bond pad itself, which also prevents oxidation.

It is not necessary for the hydride process to be performed at the time of wafer fabrication. The hydride process can take place at any stage prior to wire bonding or soldering, so long as the hydrogen-containing atmosphere is sufficiently aggressive enough to reduce any contaminants from the surface layer, and then subsequently hydride the surface layer.

The present invention also includes a single-step process in which the frangible ceramic coating is not a metal hydride. Instead, a clean copper bond pad is coated with a layer of a ceramic material having a thickness that is suitable for soldering without fluxing and that provides the layer with a Rcokwell Hardness (N-45) greater than about 38, so that the layer is sufficiently frangible during ball or wedge wire bonding to obtain metal-to-metal contact between each bonding surface and the wire bonded thereto.

Examples of suitable ceramic materials include nitrides and carbides of silicon, titanium and tantalum; oxides of aluminum, magnesium and zirconium; silicon and titanium dioxide; tungsten and boron carbide; and cubic boron nitride and diamond.

These coating layers are also formed by conventional vapor deposition or analogous techniques. The present invention thus provides bond pads with oxidation-resistant surfaces that can be ball or wedge wire bonded using conventional techniques without changes or additions to current ball and wedge wire bonding or flip chip bonding processes and equipment.

The following non-limiting example set forth hereinbelow illustrates certain aspects of the invention, but is not meant in any way to restrict the effective scope of the invention. All parts and percentages are by weight unless otherwise noted, and all temperatures are in degree Celsius.

EXAMPLE

Copper wafers having a copper thickness of at least 2,000 angstroms were made via vapor deposition. Frangible ceramic coatings of silicon nitride with thicknesses between 10 and 1,000 angstroms were formed via sputtering techniques.

Wire ball bonding was performed using various gold wires and a K&S Model 8020 wire bonder. The following wire bond process conditions were employed:

Constant velocity=0.25–1.0 mil/msec.
Ultra sonic level=35–250 mAmp or equivalent power or voltage setting
Bond time=5–50 msec.
Bond force=10–40 g
Free air ball diameter=1.4–3.0 mil A variety of gold wire types were attempted and all were found to be readily bondable: AFW-8, AFW-14, AFW-88, AFW-FP and AFW-FP2. The harder wires, AFW-FP and AFW-FP2, performed the best.

A variety of bonding tools (capillaries) were used and all were found to yield bondability in the bonded ball regions for which the capillaries were designed. The best performing capillaries were part numbers 414FA-2146-335 and 484FD-2053-335.

Copper wire was also bonded to the ceramic-coated bond pads. An inert cover gas was employed for ball formation. The bond parameters were not identical for those of gold for the same bonded ball size, but the bond parameter range was not widely different for the range for gold ball bonding onto copper substrates.

The foregoing description of the preferred embodiments should be taken as illustrating, rather than as limiting, the present invention as defined by the claims. Numerous variations and combinations of the features set forth above can be utilized without departing from the presently-claimed invention. Such variations should not be regarded as a departure from the spirit and scope of the invention, and are intended to be included within the scope of the following claims.

What is claimed is:

1. A semiconductor wafer comprising a device having at least one bond pad that is coated with a surface layer of a nitride, oxide or carbide of silicon having a thickness that is suitable for soldering without fluxing and that is sufficiently frangible during ball or wedge wire bonding to obtain metal-to-metal contact between the bonding surface and the wire bonded thereto.

2. A semiconductor wafer comprising a device having at least one bond pad that is coated with a surface layer of a ceramic material selected from the group consisting of hydrides of rare earth-copper complexes and hydrides of hydride-forming copper-immiscible metals, having a thickness that is suitable for soldering without fluxing and that is sufficiently frangible during ball or wedge wire bonding to obtain metal-to-metal contact between the bonding surface and the wire bonded thereto.

3. The wafer of claim 1 or 2, wherein said thickness of said surface provides said layer with a Rockwell Hardness (N-45) value greater than about 38.

4. The wafer of claim 1 or 2, wherein said surface layer has a thickness between about 10 and about 1,000 angstroms.

5. The wafer of claim 4, wherein said layer has a thickness between about 25 and about 500 angstroms.

6. The wafer of claim 1 or 2, further comprising at least one wire that is ball or wedge bonded to said bond pad of said wafer device.

7. The wafer of claim 1 or 2, wherein said device is a flip chip in which at least one wire lead is soldered to said metal hydride-coated bond pad.

8. A semiconductor wafer comprising a device having at least one copper bond pad having a bonding surface coated with a surface layer of a material selected from the group consisting of copper-rare earth metal complexes and copper-immiscible metals that form metal hydride compounds, said surface layer having a thickness that, upon exposure to a reducing environment containing hydrogen, forms a hydride layer having a thickness that is suitable for soldering without fluxing and that provides the layer with a hardness that is sufficiently frangible during ball or wedge wire bonding to obtain metal-to-metal contact between each bonding surface and the wire bonded thereto.

9. The wafer of claim 8, wherein said surface layer comprises a copper-immiscible metal.

10. The wafer of claim 9, wherein said surface layer is formed by co-deposition of said copper-immiscible metal and copper to form said bond pad during wafer fabrication, followed by heating of said wafer so that said copper-immiscible metal migrates to said bond pad surface, thereby forming said surface layer.

11. The wafer of claim 9, wherein said surface layer is formed by vapor deposition, electrodeposition or chemical deposition of said copper-immiscible metal onto said bond surface.

12. The wafer of claim 9, wherein said copper-immiscible metal is selected from the group consisting of Ta, V and Nb.

13. The wafer of claim 8, wherein said surface layer consists essentially of a copper-rare earth metal complex.

14. The wafer of claim 13, wherein said copper complex is formed by vapor deposition, electrodeposition or chemical deposition of said rare earth metal in a layer onto said bond pad surface.

15. The wafer of claim 14, wherein said copper complex forms by heating said deposited rare earth metal layer.

16. The wafer of claim 13, wherein said rare earth metal is selected from the group consisting of La, Y and Ce.

17. A semiconductor wafer comprising a device having at least one copper bond pad having a bonding surface coated with a surface layer of a rare earth metal that forms a copper complex, said surface layer having a thickness that, upon formation of said copper complex and exposure to a reducing environment comprising hydrogen, forms a hydride layer having a thickness that is suitable for soldering without fluxing and that is sufficiently frangible during ball or wedge wire bonding to obtain metal-to-metal contact between each bonding surface and the wire bonded thereto.

18. The wafer of claim 17, wherein said rare-earth metal is selected from the group consisting of La, Y and Ce.

19. The wafer of claim 17, wherein said surface layer is formed by vapor deposition, electrodeposition or chemical deposition of said rare earth metal in a layer on said bond pad surface.

20. A semiconductor wafer comprising a device having at least one copper bond pad having a bonded surface coated with a surface layer of a metal hydride compound selected from the group consisting of metal hydrides of copper-rare earth metal complexes and metal hydrides of copper-immiscible metals that form metal hydrides, said surface layer having a thickness that is suitable for soldering without fluxing and that is sufficiently frangible during ball or wedge wire bonding to obtain metal-to-metal contact between each bonding surface and the wire bonded thereto.

21. The wafer of claim 20, wherein said surface layer comprises a hydride of a copper-immiscible metal.

22. The wafer of claim 20, wherein said copper-immiscible metal is selected from the group consisting of Ta, V and Nb.

23. The wafer of claim 20, wherein said surface layer consists essentially of a hydride of a copper-rare earth metal complex.

24. The wafer of claim 20, wherein said rare earth metal is selected from the group consisting of La, Y and Ce.

* * * * *